(12) United States Patent
Kautzsch (10) Patent No.: US 8,957,490 B2
(45) Date of Patent: Feb. 17, 2015

(54) SILICON LIGHT TRAP DEVICES

(71) Applicant: Infineon Technologies Dresden GmbH, Dresden (DE)

(72) Inventor: Thoralf Kautzsch, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 13/930,167

(22) Filed: Jun. 28, 2013

(65) Prior Publication Data

US 2015/0001665 A1    Jan. 1, 2015

(51) Int. Cl.
*H01L 31/0232* (2014.01)
*H01L 31/0352* (2006.01)

(52) U.S. Cl.
CPC ...... *H01L 31/0352* (2013.01); *H01L 31/02327* (2013.01)
USPC ..................... 257/436; 257/E31.13

(58) Field of Classification Search
USPC .............................. 257/436, E31.13
See application file for complete search history.

(56) References Cited

U.S. PATENT DOCUMENTS

| | | | |
|---|---|---|---|
| 5,100,478 A | 3/1992 | Kawabata | |
| 6,420,647 B1 * | 7/2002 | Ji et al. | 136/259 |
| 6,538,195 B1 * | 3/2003 | Shi et al. | 136/259 |
| 6,809,008 B1 * | 10/2004 | Holm et al. | 438/455 |
| 7,592,644 B2 * | 9/2009 | Suzuki et al. | 257/184 |
| 7,755,118 B2 * | 7/2010 | Inoue | 257/291 |
| 8,258,050 B2 * | 9/2012 | Cho et al. | 438/487 |
| 8,466,529 B2 * | 6/2013 | Suzuki et al. | 257/432 |
| 8,507,960 B2 * | 8/2013 | Itonaga | 257/291 |
| 8,766,156 B2 * | 7/2014 | Kawashima et al. | 250/208.1 |
| 2005/0104163 A1 | 5/2005 | Weber et al. | |
| 2011/0203663 A1 * | 8/2011 | Prather et al. | 136/259 |
| 2012/0012741 A1 | 1/2012 | Vasylyev | |
| 2013/0044082 A1 * | 2/2013 | Lin et al. | 345/175 |
| 2014/0110805 A1 | 4/2014 | Kautzsch | |
| 2014/0158199 A1 * | 6/2014 | Vasylyev | 136/259 |
| 2014/0225215 A1 * | 8/2014 | Chien et al. | 257/447 |

OTHER PUBLICATIONS

Application and File History for U.S. Appl. No. 13/654,917, filed Oct. 18, 2012, inventor Kauzsch.

* cited by examiner

*Primary Examiner* — Ida M Soward
(74) *Attorney, Agent, or Firm* — Patterson Thuente Pedersen, P.A.

(57) ABSTRACT

Embodiments relate to buried structures for silicon devices which can alter light paths and thereby form light traps. Embodiments of the lights traps can couple more light to a photosensitive surface of the device, rather than reflecting the light or absorbing it more deeply within the device, which can increase efficiency, improve device timing and provide other advantages appreciated by those skilled in the art.

20 Claims, 9 Drawing Sheets

SILICON LIGHT TRAP DEVICES

TECHNICAL FIELD

The invention relates generally to silicon devices and more particularly to optoelectronic silicon devices.

BACKGROUND

In optoelectronic devices, light rays are absorbed and generate charge carriers within the device. These charge carriers typically are desired to be generated within a particular light ray absorption region, which can be defined by a depth within the device, such that they can be collected near the surface of the device.

Charge carriers generated deeper than the depth of this region can be thought of us undesirable noise. Conventional approaches to dealing with these charge carriers often relate to transporting them to the surface by extended electric fields or annihilating them by the targeted introduction of recombination centers. The former is not suitable in all situations, such as those with regions that must remain free of electrical fields for physical reasons, and is also limited by available voltage, while the latter reduces internal quantum efficiency and can be technically difficult to realize at very high doping atom densities. Reduced quantum efficiency in turn can affect devices dimensions, and increased complexity and technological challenges can increase costs, which are undesired.

A variety of optical sensors use infrared light for recognition of objects and distances. It is known that with increasing wavelength, the depth of penetration of light into a silicon structure increases. With the increasing depth of penetration, for time critical applications, the delay of slow diffusion currents from the greater depth to which the infrared light penetrates to the surface of the devices is slow. This can create time delays that become significant in view of the greater time required for the slow diffusion currents to reach the surface. To address these issues, for infrared wavelengths in the range of 900 nm, the prior art commonly uses electrical confinement such as built in fields. However, these electrical confinement efforts can become costly and can increase production costs to a level that is economically unfeasible.

Figure 7:
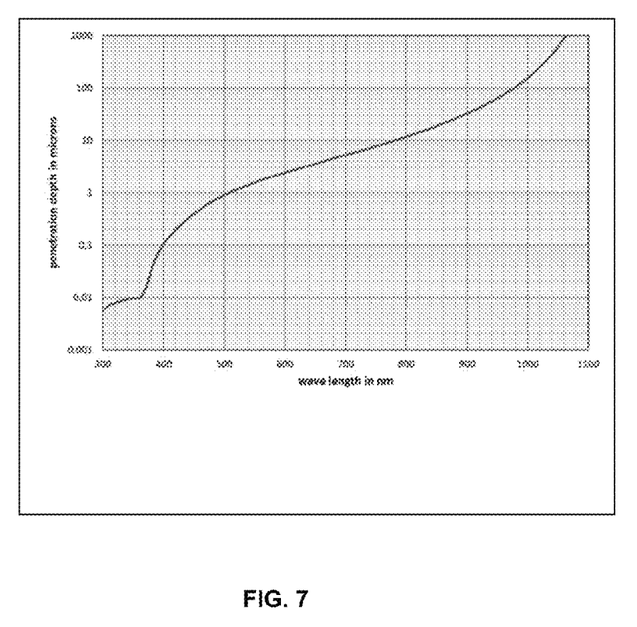
FIG. 7 is a graph depicting the penetration depth of light as a function of wavelength into silicon.

In a wide range of applications, infrared light is the light signal of choice because it is invisible to human beings. This permits measurements to be made without the awareness of human observers. In the prior art, such as proximity sensors or time of flight sensors, losses of quantum efficiency are accepted in most cases. For time critical applications, losses in quantum efficiency are sometimes even increased by implementation of recombinative regions in deeper areas of the silicon structure in an effort to eliminate disturbing background current that arises from slowly diffusing charge carriers. A graph depicting the increased penetration depth with longer wavelength is depicted in FIG. 7.

In the field of photovoltaics, in the prior art, a variety of so-called "light trapping" techniques have been disclosed. In the photovoltaic prior art, a variety of structures have been investigated for improving the light performance including inverted pyramids, dice-grooving of multi crystalline material or perpendicularly oriented grooves on the front and the back surface of the photovoltaic device. However, these techniques are unsuitable for use in CMOS integrated circuit applications because of the structures themselves. An effective photovoltaic uses a front and a rear surface that directly covers the active absorption region of the optical electronic silicon device. In standard CMOS technologies, the rear side of the structure is defined by back thinning in back end processing. Accordingly, dedicated structures for light trapping cannot be defined during at front end fabrication sequence.

Many optical electronic silicon devices benefit from having a small pixel size. High internal quantum efficiency is important to achieving small pixels sizes which require small device dimensions. In particular, in time critical applications, it is important to define a small absorption region to reduce noise components that are produced by charge carriers that are generated deep in the volume of the semi-conductor. As discussed above, this can be difficult because silicon as an indirect semi-conductor absorbs infrared wavelength spectral light components only weakly. Because of this, the penetration depth for light at wavelengths of between 800 and 900 nm, is approximately 12 micrometers to 32 micrometers. In situations where it is beneficial for photo generated charge carriers to be collected near the surface of the semi-conductor, this property of the material can be problematic for time critical device operation. According to the prior art, to address this problem, charge carriers that are generated deep in the volume of the silicon semi-conductor have been transported to the surface by the application of extended electric fields. These electric fields are built up in lightly doped zones and are limited by the available voltage. Accordingly to the prior art, regions of the semi-conductor that need to remain free of a field for physical reasons are designed such that the electron hold pairs generated therein were annihilated by the targeted introduction of recombination centers. This approach leads to reduced quantum efficiency and is technologically difficult to implement at very high impurity atom densities. Under the circumstances, the recombination active zone is overgrown with a lightly doped epitaxial layer, which is readily susceptible to being dislocated on such a support.

SUMMARY OF THE INVENTION

Embodiments relate to light trap devices, systems and methods.

In an embodiment, a device comprises a silicon structure having an exposed surface to be exposed to light rays; a photoelectrically active portion located beneath the exposed surface within the silicon structure; and an internal structure located beneath the active portion, the internal structure having an interface surface generally parallel to the exposed surface at which total internal reflection of light rays occurs such that at least some the light rays are redirected toward the photoelectrically active portion.

In an embodiment, a device comprises a silicon structure having an exposed surface to be exposed to light rays, the surface having a exposed surface plane, the exposed surface defining refractive facets that are angled to be non-parallel to the surface plane; a photoelectrically active portion located beneath the surface within the silicon structure; and an internal structure located beneath the active portion, the internal structure having an interface surface, at least part of the interface surface being generally parallel to the exposed surface plane and at which total internal reflection of light rays occurs such that at least some of the light rays are redirected toward the photoelectrically active portion.

In an embodiment, a device comprises a silicon structure having an exposed surface to be exposed to light rays; a photoelectrically active portion located beneath the surface within the silicon structure; an internal structure located beneath the photoelectrically active portion, the internal structure having at least one interface surface not parallel to the exposed surface at which total internal reflection of light rays occurs such that at least some light rays are redirected toward the photoelectrically active portion, toward the exposed surface or both; and a perimeter structure located proximate a perimeter of the silicone structure and extending at least partially above the internal structure and below the exposed surface, the perimeter having an internally directed interface at which total internal reflection of at least some of the light rays occurs.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to buried structures for silicon devices which can alter light paths and thereby form light traps. Embodiments of the lights traps can couple more light to a photosensitive surface of the device, rather than reflecting the light or absorbing it more deeply within the device, which can increase efficiency, improve device timing and provide other advantages appreciated by those skilled in the art.

In an embodiment, a device comprises a silicon structure having a surface to be exposed to light rays; and a light trap structure formed within the silicon structure spaced apart from the surface and comprising a plurality of light trap elements adjacent one another and each having a surface proximate to and unparallel with the surface to be exposed to light rays.

In an embodiment, a light trap structure buried within a silicon structure and comprises a plurality of light trap elements adjacent one another and each having a surface proximate to and unparallel with a surface of the silicon structure to be exposed to light rays.

In an embodiment, a method comprises providing a silicon structure; and forming a plurality of light trap elements adjacent one another in the silicon structure and each having a surface proximate to and unparallel with a surface of the silicon structure to be exposed to light rays.

One concern that arises with the utilization of light traps, as described herein, is that photo generation of free charge carriers is concentrated in a thin layer, having a thickness of a few micrometers, at the surface. The use of non-plane-parallel structural elements to produce total internal reflection of light at interfaces of the structures directs light rays such that they may travel in paths that are nearly parallel to the chip surface. This can lead to light rays striking interfaces between pixels at angles below the critical angle for total internal reflection and thus lead to optical cross talk with adjacent pixels.

An electronic silicon device defines a trench structure that is located near the perimeter of a pixel. A trench is located at or near the pixel perimeter and may be lined with a polycrystalline silicon liner with which electrical contact can be made and which, according to an embodiment, is overgrown with a thermal oxide. The perimeter trench may be encapsulated on a top side thereof, for example, by use of an HDP oxide deposition process. The trench performs both optical and electrical functions. Because of the polycrystalline silicon liner with which contact can be made, the trench can influence the recombination behavior at a trench wall. Depending on applied voltage and accumulation layer or an inversion layer can be produced proximate the trench wall. If the photosensitive element is to be laterally passivated, the presence of the accumulation layer provides for a reduced surface recombination rate.

An optical effect of the trench is the suppression of optical cross talk between adjacent pixels. Almost all incident light rays are totally internally reflected upon encountering the trench cavity interface. Transition from an optical medium having a quite high refractive index to a medium having a refractive index approximating one leads to a small critical angle of approximately sixteen degrees for total internal reflection. Accordingly, radiation components that are traveling nearly parallel with the front surface of the electronic device are retained within the pixel and do not affect adjacent pixels. The width of the air gap of the trench affects the efficiency of elimination of optical cross talk. Small gap widths may permit the passage of a certain amount of light. According to an embodiment, the gap width may even be in the range of 1 to 3 times the wavelength of the incident light.

In an embodiment, an optical electronic structure includes a perimeter trench that provides electrical and optical effects. The trench structure may include an electrically conductive liner and a cavity within. This results in an adjustable electrical recombination activity at the interface and a small critical angle for total internal reflection of incident radiation.

According to an embodiment, a photoelectronic device includes pyramidal facets formed thereon or therein. According to another embodiment, in a case of masked structural process, a photoelectronic device includes inverted pyramid or roof structures thereon or therein. Roof structures may have a long axis that is parallel in several roof structures.

In an another embodiment, a photoelectronic device includes a roof structure that refractively redirects light and a deeper cavity structure having an interface that causes total internal refraction of light back toward the roof structure.

According to another embodiment, a photoelectronic structure includes a plurality of light trap elements having a surface non-parallel with the surface to be exposed to light rays that redirect incoming light by total internal reflection and a more deeply located internal structure having an interface that redirects light upward by total internal reflection.

According to an embodiment, internal structures may be arranged so that a roof structure has many optical facets having a long axis in a first direction and a more deeply located tubular structure having many elongate tubes is located more deeply in the photoelectronic device and is orthogonal to or otherwise non-parallel to the long axis of the roof structure.

According to an embodiment, a silicon structure has an exposed surface to be exposed to light rays; a photoelectrically active portion located beneath the exposed surface within the silicon structure; and an internal structure located beneath the active portion, the internal structure having an interface surface generally parallel to the exposed surface at which total internal reflection of light rays occurs such that at least some the light rays are redirected toward the photoelectrically active portion.

According to an embodiment, a silicon structure has an exposed surface to be exposed to light rays, the surface having a exposed surface plane, the exposed surface defining refractive facets that are angled to be non-parallel to the surface plane; a photoelectrically active portion located beneath the surface within the silicon structure; and an internal structure located beneath the active portion, the internal structure having an interface surface, at least part of the interface surface being generally parallel to the exposed surface plane and at which total internal reflection of light rays occurs such that at least some of the light rays are redirected toward the photoelectrically active portion.

According to an embodiment, a silicon structure has an exposed surface to be exposed to light rays; a photoelectrically active portion located beneath the surface within the silicon structure; an internal structure located beneath the photoelectrically active portion, the internal structure having at least one interface surface not parallel to the exposed surface at which total internal reflection of light rays occurs such that at least some light rays are redirected toward the photoelectrically active portion, toward the exposed surface or both; and a perimeter structure located proximate a perimeter of the silicone structure and extending at least partially above the internal structure and below the exposed surface, the perimeter having an internally directed interface at which total internal reflection of at least some of the light rays occurs.

Figure 1:
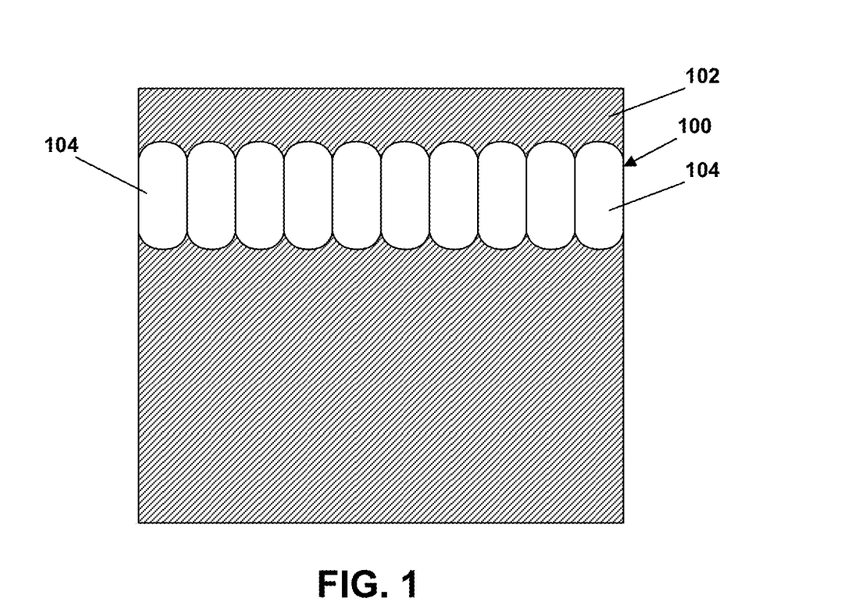
FIG. 1 is a side cross-sectional view of a light trap structure in a silicon structure according to an embodiment.

Referring to FIG. 1, an embodiment of a light trap structure 100 embedded in a silicon structure 102 is depicted. Silicon structure 102 can comprise or consist of silicon in various embodiments, and in still other embodiments can comprise material(s) other than silicon. Light trap structure 100 comprises a plurality of light trap elements 104 arranged immediately adjacent one another. Light trap elements 104 can have length and/or width dimensions of about 0.5 µm to about 3 µm, height dimensions of about 1 µm to about 5 µm, and be disposed about 0.7 µm to about 50 µm from a top surface of silicon structure 102 in embodiments, though these dimensions can vary in other embodiments. For example, light trap elements 104 can be formed from trenches that extend partially, substantially or entirely along a length of silicon structure 102.

Figure 2:
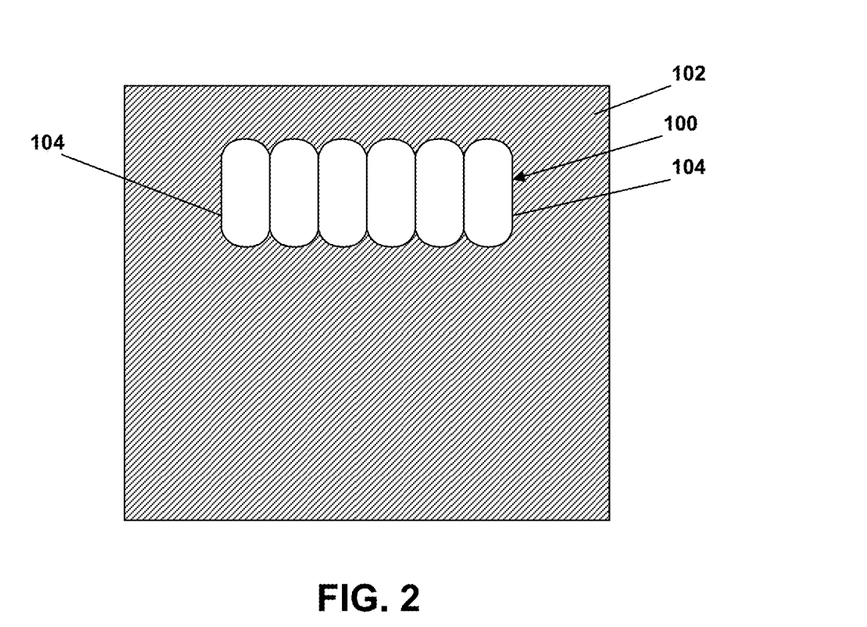
FIG. 2 is a side cross-sectional view of a light trap structure in a silicon structure according to an embodiment.

In embodiments, light trap elements 104 comprise cavities filled with air or some other suitable gas or material. Light trap structure 100 also can comprise a single light trap element 104 having the overall outline shape of structure 100 depicted in FIG. 1 but with the individual cavities being linked or joined to form a single cavity structure. Light trap structure 100 can comprise a single row of light trap elements 104 or a matrix of light trap elements, for example comprising four rows having eight elements 104 each. Though depicted in FIG. 1 as extending from one side of silicon structure 102 to the other, in other embodiments light trap structure can be formed in only a portion of silicon structure 102, such as is depicted in FIG. 2.

Figure 3:
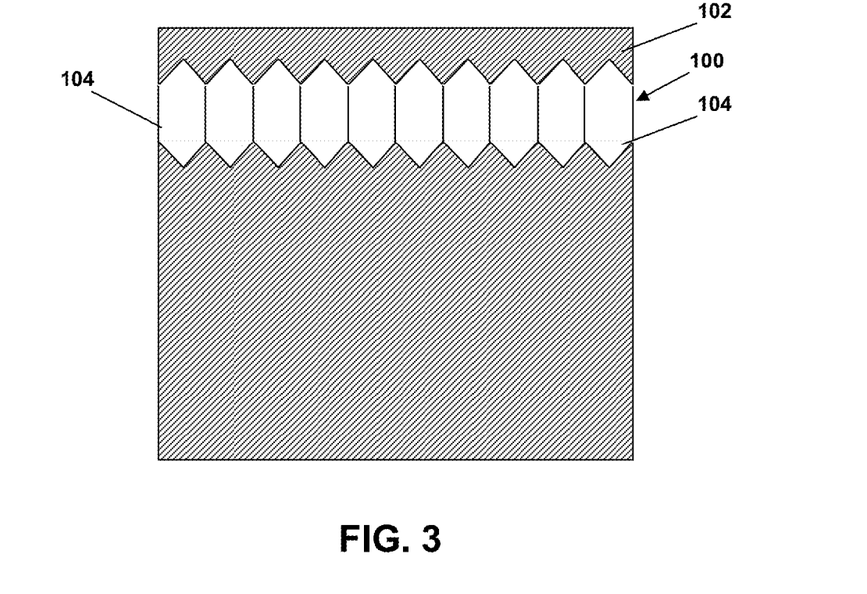
FIG. 3 is a side cross-sectional view of a light trap structure in a silicon structure according to an embodiment.

In the embodiment of FIG. 1, light trap elements 104 comprise curved, rounded or arched top and bottom (with respect to the depiction of the drawing on the page) portions. In other embodiments, only the top can be curved and the bottom can have some other shape or structure, for example being generally flat and therefore parallel with a top surface of silicon structure 102. In still other embodiments, light trap elements 104 can have other shapes, such as peaked or pointed as depicted in FIG. 3. In general, however, it can be seen that the surface of each light trap element 104 adjacent or opposing the upper surface of silicon structure 102 are angled, curved or otherwise unparallel with that upper surface.

The particular radius of curvature (FIGS. 1 and 2) or angle (FIG. 3) of the surfaces of light trap elements 104 can vary in embodiments according to materials used, light wavelengths and other factors. For example, silicon has a relatively high refractive index, such as between about 3.5 and 5.5 depending upon the wavelength of light. For a light wavelength of about 850 nm, a critical angle of about 16 degrees exists: all light rays impinging from silicon structure 102 on an interface with a vacuum or air layer at an angle greater than about 16 degrees will be totally reflected. Thus, light rays which enter silicon structure 102 and are reflected internally at an angle greater than 16 degrees will be subject to total reflection within silicon structure 102. In other embodiments, silicon structure 102 can comprise some other material, such as germanium, gallium arsenide, another 3-5 group semiconductor material, or another suitable material. Germanium and gallium arsenide, for example, generally have high refraction indices, like silicon, such that the total reflection angle will be below about 20 degrees in these embodiments as well, though one skilled in the art will appreciate that the angle can vary according to the properties of the material(s) used.

Figure 4:
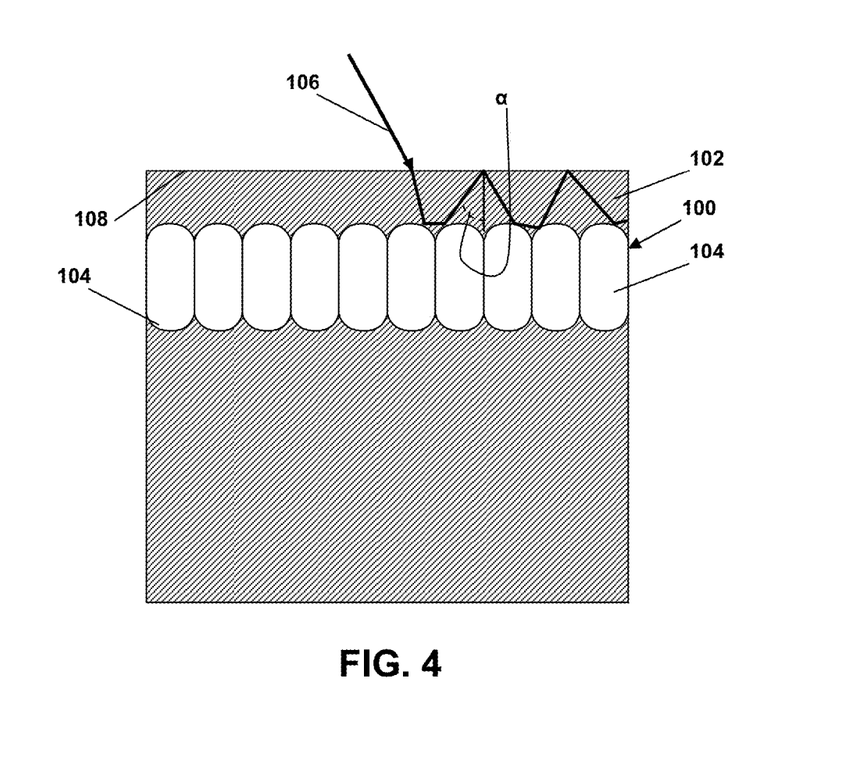
FIG. 4 is a side cross-sectional view of a light ray striking a silicon structure having a light trap structure according to an embodiment.

Referring to FIG. 4, a light ray 106 impinging on silicon structure 102 is reflected by light trap structure 100 back toward the surface 108, which is a silicon-air interface. Because of the arched structure of the light trap elements 104, ray 106 impinges on surface 108 from within silicon structure 102 at an angle α greater than about 16 degrees. This causes ray 106 to be reflected back toward light trap structure 100, which again causes ray 106 to strike surface 108 at an angle greater than about 16 degrees and be reflected internally. This internal reflection caused by altering the path of light ray 106 by light trap structure 100 can improve the efficiency of the device because a larger portion of light impinging on the device can be used by the device, such as by coupling more light to a photo surface of the device rather than be reflected externally.

The embodiment of FIG. 3 also can provide advantages. For example, the peaked light trap elements 104 of FIG. 3 can be more efficient by presenting a smaller portion of each element 104 which would cause the light to be reflected externally. In other words, the number of light rays striking the very peak of the light elements 104 generally will be very small, such that more light rays will be reflected internally similar to as depicted in FIG. 4.

Figure 5A:
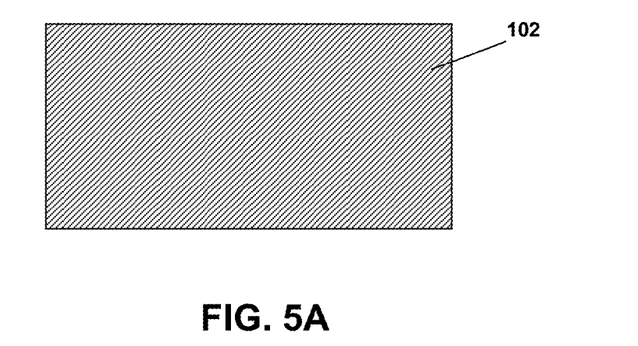
FIG. 5A is a side cross-sectional view of a silicon structure according to an embodiment.
Figure 5B:
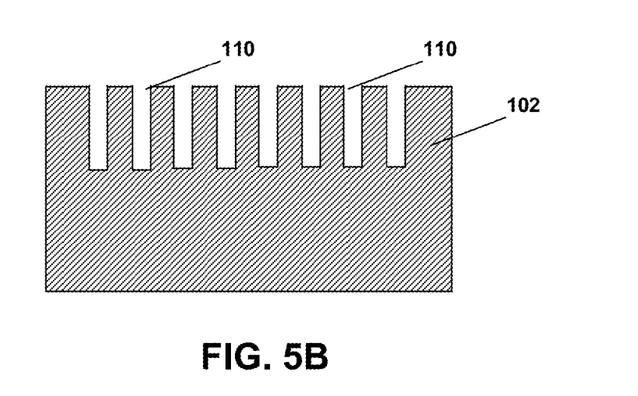
FIG. 5B is a side cross-sectional view of a plurality of trenches formed in a silicon structure according to an embodiment.
Figure 5C:
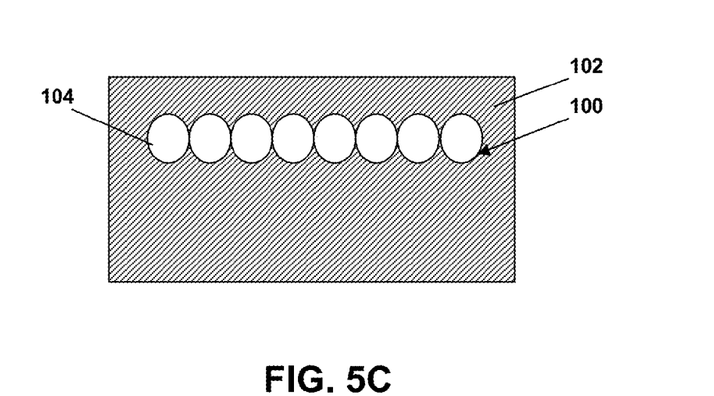
FIG. 5C is a side cross-sectional view of a plurality of cavities formed from the trenches of FIG. 5B according to an embodiment.
Figure 5D:
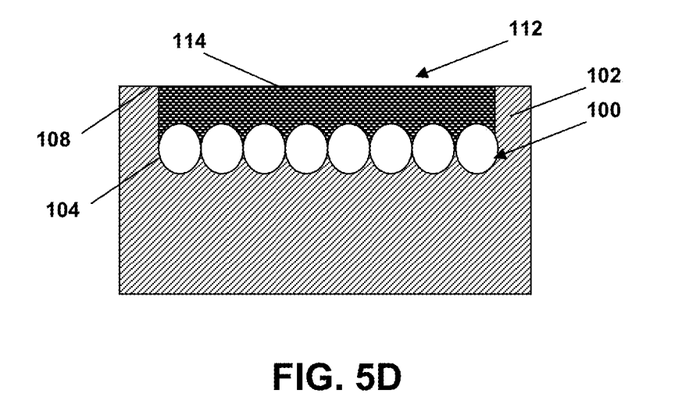
FIG. 5D is a side cross-sectional view of a photodetector device comprising a light trap structure according to an embodiment.

Referring next to FIGS. 5A-5D, one example process for forming light trap structure 100 is depicted. In one embodiment, a Venezia process for forming cavities in monocrystalline silicon can be used, though other processes can be used in this and other embodiments. In FIG. 5A, a silicon structure 102, such as a silicon wafer, is provided. In FIG. 5B, at least one trench 110 is etched in silicon structure 102. Silicon structure 102 is then exposed to a hydrogen atmosphere and a reflow process or epitaxy step, which results in the silicon-on-nothing structure 102 depicted in FIG. 5C, in which light trap elements 104 have been formed from each of the at least one trenches 110. FIG. 5D depicts one example of a final photo-sensitive structure 112, such as a photo diode, after formation of a photo detector 114 between light trap structure 100 and surface 108. As depicted in FIG. 5D, photo-sensitive structure 112 forms only a portion of surface 108, such as a photo-sensitive "window" of the device, though this can vary in other embodiments to include an entire surface or a plurality of photo-sensitive structures spaced apart at a surface or some other arrangement.

The process can vary for other embodiments, such as the peaked light trap structure 100 of FIG. 3. For such an embodiment, for example, silicon structure 102 and trenches 110 can be treated with an alkaline solution to anisotropically etch the silicon, thereby uncovering the (111) surface of the silicon, which results in the peaks of FIG. 3 as the angle of about 54.7 degrees between (100) and (111) planes of the silicon of silicon structure 102. Other surfaces of the silicon, such as the (110) surface also can be used in embodiments to produce different angles of the peaks, which vary with the crystal orientation of the silicon, though other angles can be less efficient. For example, the angle can be between about 50 degrees and about 60 degrees, such as between about 53 and 56 degrees, for example about 54.7 degrees in embodiments.

Figure 6:
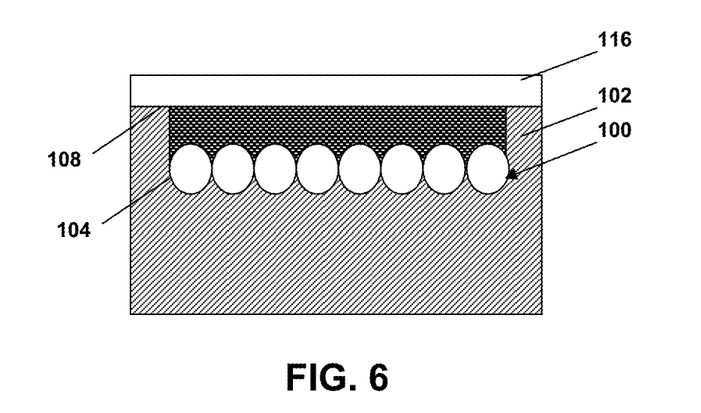
FIG. 6 is a side cross-sectional view of a light trap structure in a silicon structure having a light-focusing roof structure according to an embodiment.

Other features and elements can be incorporated in embodiments. For example, and referring to FIG. 6, a roof structure 116 can be used with light trap structure 100 to further maximize quantum efficiency. Such a roof structure 116 can be used in photovoltaics, such as high-powered solar cells, and other applications to better channel or focus light rays to photosensitive elements below. In embodiments, roof structure 116 comprises a plurality of inverted pyramid, funnel or other light-focusing structures and can be formed by a masked potassium hydroxide solution etch or some other suitable process step(s). Roof structure 116 need not be a separate layer as depicted but instead can be an area or portion of silicon structure 102 that is etched, patterned or otherwise altered to include one or more light-focusing structures. In another example, light trap structure 100 can comprise a thermal liner oxide layer in order to electrically passivate the interface between surface 108 and/or to electrically insulate the region from the substrate below. Using roof structure 116 and/or a thermal liner oxide layer in combination with a light trap structure can thereby provide benefits in embodiments.

Referring to FIG. 7, a graph relating penetration depth as a function of wavelength of light into a silicon structure is depicted. As can be seen, penetration depth increases as a function of wavelength. Accordingly, infrared light passes more deeply into the silicon structure before it is absorbed than shorter wavelengths of light. Since infrared light is preferred for many functions because of its invisibility to human vision, the present invention redirects infrared light into the photoelectrically active part of a silicon substrate, thus increasing efficiency of each pixel.

Figure 8:
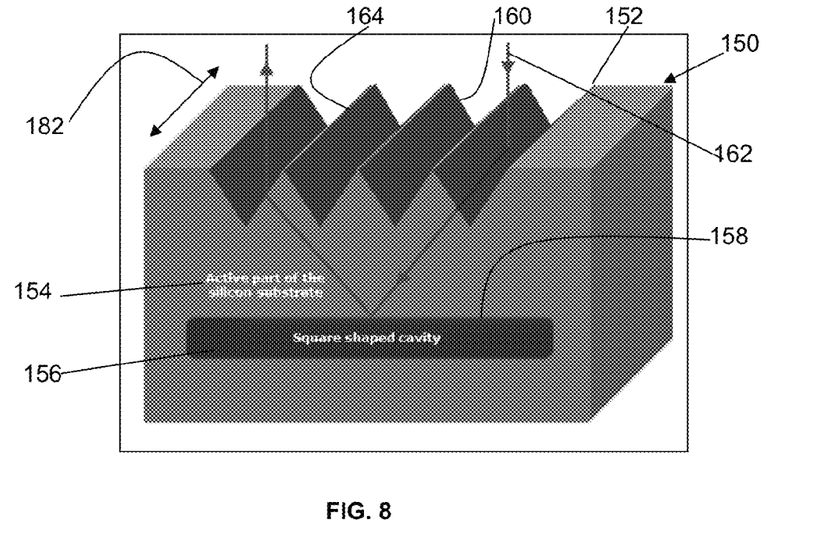
FIG. 8 is a side cross sectional and perspective view of a silicon structure according to an embodiment.

Referring to FIG. 8, an embodiment of a silicon structure 150 is depicted. According to the depicted embodiments, silicon structure 150 includes exposed surface 152, photoelectrically active portion 154, internal structure 156, interface surface 158 and refractive facets 160. Internal structure 156 may be formed as a cavity generated by application of a silicon on nothing processing scheme. Refractive facets 160 of expose surface 152 may be structured by anisotropic etching with a strong alkaline substance, for example, KOH or TMAH. Accordingly, refractive facets 160 may be formed as pyramidal facets or, by application of a masked structuring process inverted pyramid or roof structures. In the depicted embodiment, refractive facets 160 refract light ray 162 directing it at an angle to exposed surface 152 toward interface surface 158 where it is totally internally reflected at interface surface 158 and redirected toward refractive facets 160 where it is refracted back outwardly from exposed surface 152. Despite the simply configuration of the embodiment depicted in FIG. 8, the light path is extended by a factor of approximately 2.5 if silicon oxide is used as filler in roof structure 164 of refractive facets 160 at exposed surface 152. If inverted pyramids are used, the light path extension factor increases beyond 2.5.

Figure 9:
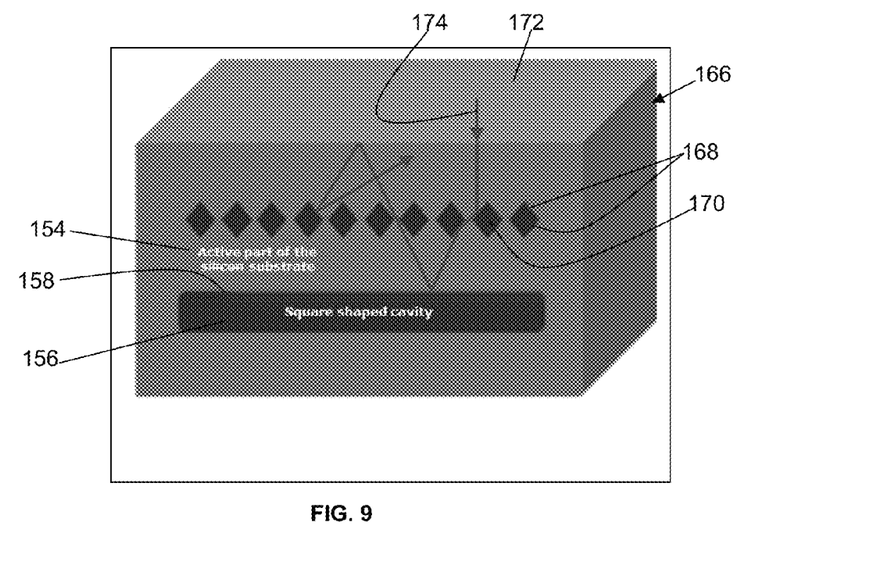
FIG. 9 is a side cross sectional and perspective view of a silicon structure according to an embodiment.

Referring to FIG. 9, another depicted embodiment includes scattering facets 168 at interface surface 158 between silicon structure 150 and scattering facet cavities 170 and presents exposed planar surface 172. Internal structure 156 presenting interface surface 158 is generally similar to that described above. Scattering facet cavities 170 may be located above or within photoelectrically active portion 154. Scattering facets 168 are oriented non parallel to exposed planar surface 172. As depicted in FIG. 9, light ray 174 passes through exposed planar surface 172 and is totally internally reflected at scattering facets 168. Total internal reflection may also occur at interface surface 158 and exposed planar surface 172 when light ray 174 strikes the surfaces at an angle greater than the critical angle of total internal reflection for silicon. As discussed above, the critical angle is approximately 16. Accordingly, light ray 174 may incur multiple total internal reflections at scattering facets 168, the underside of exposed planar surface 172 and at interface surface 158.

Accordingly, light ray 174 passes through photoelectrically active portion 154 multiple times thus creating further photoelectrical activity until the energy of light ray 174 is absorbed or until its strikes an internal surface of silicon structure 166 at an angle less than the critical angle and leaves silicon structure 166.

Figure 10:
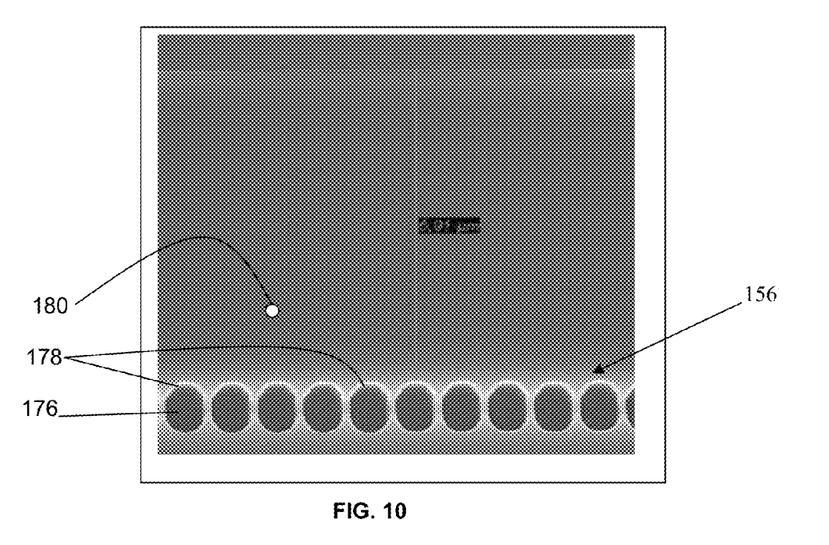
FIG. 10 is a side cross sectional view of a silicon structure including a layer of adjacent tubes each having a long axis.

Referring to FIG. 10, another embodiment is depicted. Silicon structure 166, according to the depicted embodiment includes another configuration of internal structure 156. Internal structure 156 may be formed as layer 176 of adjacent tubes 178. Adjacent tubes 178 have long axis 180 which is perpendicular to the plane of the drawing of the depicted embodiment. Internal structure 156 including adjacent tubes 178 may be utilized in combination with roof structure 164 as depicted in FIG. 8. As discussed above, long axis 180 of adjacent tubes 178 is perpendicular to the page in FIG. 10. When utilized with roof structure 174, according to an example embodiment, roof structure 164 has long axis 182 depicted in FIG. 10. Accordingly, long axis 180 of adjacent tubes 178 and long axis 182 of roof structure 164 may be oriented orthogonal to one another or otherwise non-parallel to one another.

Figure 13:
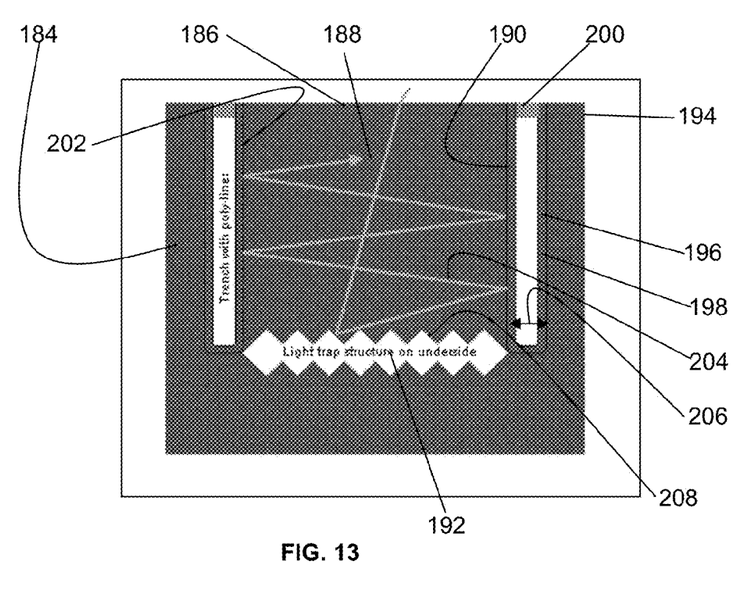
FIG. 13 is a side cross sectional view of a silicon structure including a perimeter trench structure and an internal structure and a polycrystalline silicon liner.

Referring particularly to FIG. 13, according to the depicted embodiment, silicon structure 184 includes exposed surface 186, photoelectrically active portion 188, perimeter structure 190 and internal structure 192.

Perimeter structure 190, according to the depicted embodiment, is located generally adjacent perimeter 194 of silicon structure 184. Accordingly, perimeter structure 190 surrounds photoelectrically active portion 188. In addition, internal structure 192 borders a bottom of photoelectically active portion 188. Perimeter structure 190 may present trench structure 196. Accordingly, in the case of a pixel, trench structure 196 delimits perimeter 194 of the pixel.

According to an embodiment, trench structure 196 further includes polycrystalline silicon liner 198 and may include an encapsulation 200 at a top thereof. Polycrystalline silicon liner 198 is structured so that electrical contact can be made therewith. According to an embodiment, polycrystalline silicon liner 198 may be overgrown with a thermal oxide. Encapsulation 200 is located at a top of trench structure 196 and may be formed for example, by application of an HDP oxide deposition process.

Figure 11:
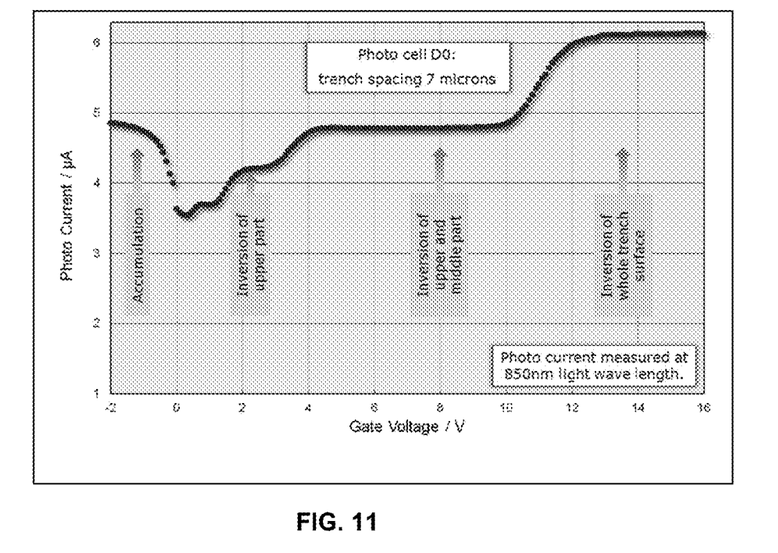
FIG. 11 is a graph depicting photo current as a function of gate voltage.

According to an embodiment, trench structure 196 performs at least two functions. First, because of polycrystalline silicone liner 198 with which contact can be made, it is possible to influence recombination behavior at trench interface 202. Depending on applied voltage, an accumulation layer or an inversion layer can be produced. If silicon structure 150 is to be laterally passivated, the accumulation layer provides for a reduced surface recombination rate. Referring to FIG. 11, the depicted graph illustrates this effect. The accumulation of majority charged carriers leads to a higher photocurrent at a voltage of minus 2 volts. Given a positive voltage at the trench electrode and a p-type doped bulk, an inversion layer is established. In this case, a connection of the inversion layer and a n-type doped emitter leads to increased photoefficiency, too. Here, the inversion layer becomes part of the emitter and electron-hole pairs are seperated before reaching the recombinative trench surface.

A second function of perimeter structure 190 and trench structure 196 is suppression of optical cross talk between adjacent pixels, because of total internal reflection at trench interface 202. As is known, the transition at interface from an optically dense medium, here silicon having a refractive index of approximately 3.6 to a less optically dense medium having a refractive index approximately equal to one leads to a small critical angle of approximately 16° from a normal to a surface for total internal reflection. Even light ray 204 components redirected by internal structure 192 relatively close to parallel to exposed surface 186 are held within silicon structure 184 and inhibited from passing into adjacent pixels.

Figure 12:
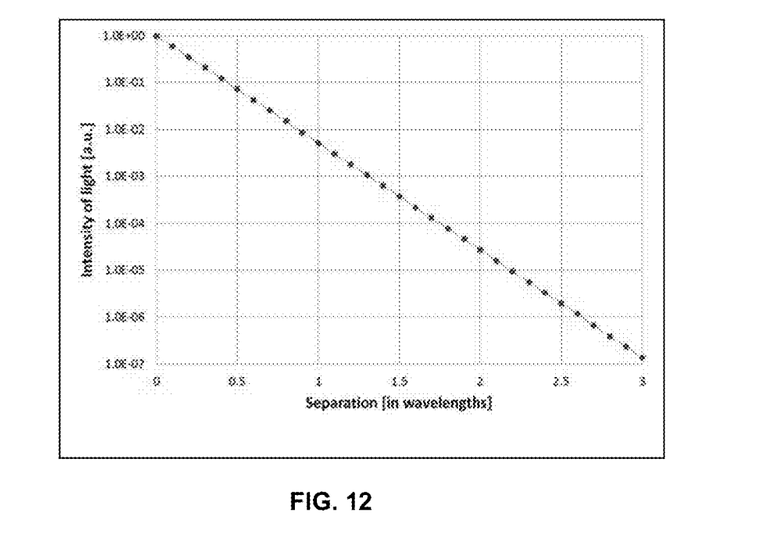
FIG. 12 is a graph depicting power as a function of trench widths according to an embodiment.

Referring particularly to FIG. 12, it should be understood that optical tunneling may occur in the case of small width 206 of trench structure 196. As can be seen in the graph depicted in FIG. 12, the amount of transmitted radiation is an inverse function of light wavelength and an inverse function of width 206. The graph in FIG. 12, depicts an experimentally determined relationship related to trench structure 196. When a width 206 of trench structure 196 of approximately one wavelength is utilized light transmission is damped by approximately two orders of magnitude.

Accordingly, according to one embodiment, width 206 is greater than approximately one wavelength of the light desired to be totally internally reflected. According to another embodiment, width 206 is greater than two wavelengths of the light to be totally internally reflected and according to another embodiment, width 206 is greater than approximately three wavelengths of the light to be totally internal reflected.

Referring to FIG. 13, internal structure 192 includes reflective facets 208. Reflective facets 208 are angled similarly to other structures discussed elsewhere in this application. At reflective facets 208, total internal reflection occurs which causes a least some of light rays 204 to strike trench interface 202 at an angle greater than the critical angle for total internal reflection and some of light rays 204 to strike exposed surface 186 at an angle greater than the critical angle. Thus, the depicted embodiment largely inhibits optical and electrical interaction between adjacent pixels. The maintenance of light rays within each pixel leads to greater absorption of light energy and greater efficiency.

Embodiments thereby provide improved light trap structures for silicon devices which can alter light paths. Embodiments of the lights traps can couple more light to a photosensitive surface of the device, rather than reflecting the light or absorbing it more deeply within the device, which can increase efficiency, improve device timing and provide other advantages appreciated by those skilled in the art.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A device comprising:
a silicon structure having an exposed surface be exposed to light rays;
a photoelectrically active portion located beneath the exposed surface within the silicon structure; and
an internal structure located beneath the active portion, the internal structure having art interface surface generally parallel to the exposed surface at which total internal reflection of light rays occurs such that at least some of the light rays are redirected toward the photoelectrically active portion.

2. The device of claim 1, wherein the exposed surface further comprises refractive facets that are angled relative to the interface surface so as to be non-parallel relative to the interface surface.

3. The device of claim 1, wherein the internal structure comprises a cavity.

4. The device of claim 3, wherein the cavity is defined, at least in part, by the interface surface and a second surface that is separated from and substantially parallel to the interface surface.

5. The device of claim 1, further comprising a perimeter trench proximate a perimeter of the silicon structure having an internal interface surface that is oriented substantially perpendicular to the interface surface.

6. The device of claim 1, further comprising scattering facets located within the silicon structure above or within the photoelectrically active portion, wherein the scattering facets redirect light rays by total internal reflection.

7. The device of claim 6, wherein the scattering facets are farmed at the interfaces of cavities within the silicon structure and the cavities are adjacent one another and spaced from one another.

8. The device of claim 7, wherein the cavities are substantially diamond shaped in cross section.

9. A device comprising:
a silicon structure having an exposed surface to be exposed to light rays, the surface having an exposed surface plane, the exposed surface defining refractive facets that are angled to be non-parallel to the surface plane;
a photoelectrically active portion located beneath the surface within the silicon structure; and
an internal structure located beneath the active portion, the internal structure having an interface surface, at least part of the interface surface being generally parallel to the exposed surface plane and at which total internal reflection of light rays occurs such that at least some of the light rays are redirected toward the photoelectrically active portion.

10. The device wherein the internal structure comprises cavity.

11. The device of claim 9, wherein the cavity is defined, at least in part, by tip interface surface and a second surface that as separated from and substantially parallel to the interface surface.

12. The device of claim 9, further comprising a perimeter trench proximate a perimeter of the silicon structure, the perimeter trench having an internal interface surface that is oriented substantially perpendicular to the exposed surface plane.

13. The device of claim 9, wherein the refractive facets have a first long axis oriented generally parallel to each other and in a first direction and the internal structure further comprises a layer of adjacent tub each having a second long axis, the second long axis being substantially orthogonal to the first axis.

14. A device comprising:
a silicon structure having an exposed surface to be exposed to light rays;
a photoelectrically active portion located beneath the surface within the silicon structure;
an internal structure located beneath the photoelectrically active portion, the internal structure having at least one interface surface not parallel to the exposed surface at which total internal reflection of light rays occurs such that at least some light rays are redirected toward the photoelectrically active portion, toward the exposed surface or both; and
a perimeter structure located proximate a perimeter of the silicon structure and extending at least partially above the internal structure and below the exposed surface, the perimeter having an internally directed interface at which total internal reflection of at least some of the light rays occurs.

15. The device of claim 14, wherein the perimeter structure is formed as a perimeter trench.

16. The device of claim 15, wherein the perimeter trench has a width greater than approximately one wavelength of the light to be totally internally reflected and less than approximately four wavelengths of the light to be totally internally reflected.

17. The device of claim 15, wherein the perimeter trench further comprises a conducting liner.

18. The device of claim 15, wherein the perimeter trench further comprises an encapsulation at a top thereof.

19. The device of claim 14, wherein the internal structure comprises a cavity defined by reflective facets oriented non-parallel to the exposed surface.

20. The device of claim 17, wherein the conducting liner comprises a polysilicon liner.

\* \* \* \* \*